(12) United States Patent
Narayanasamy et al.

(10) Patent No.: US 11,271,562 B2
(45) Date of Patent: Mar. 8, 2022

(54) SOLID-STATE RELAY WITH ISOLATOR

(71) Applicant: TEXAS INSTRUMENTS INCORPORATED, Dallas, TX (US)

(72) Inventors: Navaneeth Kumar Narayanasamy, Coimbatore (IN); Manu Balakrishnan, Kollam (IN); Miroslav Oljaca, Allen, TX (US)

(73) Assignee: Texas Instmments Incorporated, Dallas, TX (US)

( * ) Notice: Subject to any disclaimer, the term of this patent is extended or adjusted under 35 U.S.C. 154(b) by 0 days.

(21) Appl. No.: 17/072,289

(22) Filed: Oct. 16, 2020

(65) Prior Publication Data

US 2021/0119629 A1  Apr. 22, 2021

Related U.S. Application Data

(60) Provisional application No. 62/959,200, filed on Jan. 10, 2020.

(30) Foreign Application Priority Data

Oct. 18, 2019  (IN) .............................. 201941042290

(51) Int. Cl.
*H03K 17/08* (2006.01)
*H03K 17/0812* (2006.01)
*H03K 17/082* (2006.01)
*H03K 17/687* (2006.01)
*H03K 17/76* (2006.01)
*H03K 17/693* (2006.01)

(52) U.S. Cl.
CPC ... *H03K 17/6872* (2013.01); *H03K 17/08122* (2013.01); *H03K 17/693* (2013.01); *H03K 17/76* (2013.01)

(58) Field of Classification Search
None
See application file for complete search history.

(56) References Cited

U.S. PATENT DOCUMENTS 6,178,077 B1 *  1/2001  Kaluza ..................... H02H 3/08
                                                                                361/100
6,876,245 B2 *  4/2005  de Buda ............ H03K 17/6874
                                                                                327/427

* cited by examiner

*Primary Examiner* — Kenneth B Wells
(74) *Attorney, Agent, or Firm* — John R. Pessetto; Charles A. Brill; Frank D. Cimino

(57) ABSTRACT

A solid-state relay circuit includes an isolator circuit, a first output terminal, a second output terminal, and an output switch. The output switch is coupled to the isolator circuit, and includes a first transistor, a second transistor, and a diode. The first transistor is coupled to the first output terminal. The second transistor is coupled to the first transistor and the second output terminal. The diode is coupled to the first transistor, the second transistor, and ground, and is configured to block current flow from ground to the first transistor and the second transistor. The isolator circuit is coupled to the output switch and is configured to activate the first transistor and the second transistor.

19 Claims, 13 Drawing Sheets

SOLID-STATE RELAY WITH ISOLATOR

CROSS-REFERENCE TO RELATED APPLICATIONS

The present application claims priority to U.S. Provisional Patent Application No. 62/959,200, filed Jan. 10, 2020, entitled "Multi-Channel Solid-state Relay Using Multiple Output Digital Isolator and Common Gate Drive Supply," and to India Provisional Patent Application No. 201941042290, filed Oct. 18, 2019, entitled High Voltage Solid State Relay Using Digital Isolators," both of which are hereby incorporated herein by reference in their entirety.

BACKGROUND

Electromechanical relays or solid-state relays can be used to switch electrical loads. Electromechanical relays use mechanical contacts that make or break the electrical connection in a circuit, and the mechanical contacts are typically controlled using an actuator coil. The moving mechanical contacts, and wear and tear, limit the life of electromechanical relays, with the life span typically specified as a number of switching cycles. Solid state relays provide the functionality of electromechanical relay without any moving parts. Solid state relays use semiconductor switches to make or break the electrical connection. The absence of moving parts significantly improves the life of solid-state relays compared to electromechanical relays.

SUMMARY

A plurality of solid-state relays driven by a multi-channel isolator using a single isolated power supply is disclosed herein. In one example, a solid-state relay circuit includes an isolator circuit, a first output terminal, a second output terminal, and an output switch. The output switch is coupled to the isolator circuit, and includes a first transistor, a second transistor, and a diode. The first transistor includes a first terminal coupled to the first output terminal, and a second terminal coupled to an output of the isolator circuit. The second transistor includes a first terminal coupled to the second output terminal, a second terminal coupled to the second terminal of the first transistor, and a third terminal coupled to a third terminal of the first transistor. The diode includes a cathode terminal coupled to ground, and an anode terminal coupled to the third terminal of the second transistor.

In another example, a solid-state relay circuit includes a first output terminal, a second output terminal, an output switch, and an isolator circuit. The output switch includes a first transistor, a second transistor, and a diode. The first transistor is coupled to the first output terminal. The second transistor is coupled to the first transistor and the second output terminal. The diode is coupled to the first transistor, the second transistor, and ground, and is configured to block current flow from ground to the first transistor and the second transistor. The isolator circuit is coupled to the output switch and is configured to activate the first transistor and the second transistor.

In a further example, a solid-state relay circuit includes a first output terminal, a second output terminal, an output switch, a gate discharge circuit, a high impedance voltage translation circuit, and an isolator circuit. The output switch includes a first transistor, a second transistor, and a diode. The first transistor is coupled to the first output terminal. The second transistor is coupled to the first transistor and the second output terminal. The diode is coupled to the first transistor, the second transistor, and ground, and is configured to block current flow from ground to the first transistor and the second transistor. The gate discharge circuit is configured to shunt voltage at a gate terminal of the first transistor and at a gate terminal of the second transistor to a source terminal of the first transistor and a source terminal of the second transistor. The high impedance voltage translation circuit is coupled to the gate discharge circuit and is configured to boost drive voltage to and present a high impedance to the first transistor and the second transistor. The isolator circuit is coupled to the high impedance voltage translation circuit and is configured to activate the output switch.

In another example, a solid-state relay circuit includes a first output terminal, a second output terminal, an output switch, and a zero-crossing control circuit. The output switch comprising a diode bridge, a sense resistor, and a transistor. The diode bridge includes a first terminal coupled to the first output terminal, a second terminal coupled to the second output terminal, a third terminal, and a fourth terminal. The sense resistor includes a first terminal coupled to the fourth terminal of the diode bridge, and a second terminal. The transistor includes a first terminal coupled to the third terminal of the diode bridge, a second terminal, and a third terminal coupled to the second terminal of the sense resistor. The zero-crossing control circuit includes an input terminal coupled to the second terminal of the sense resistor, and an output terminal coupled to the second terminal of the transistor.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Figure 1A:
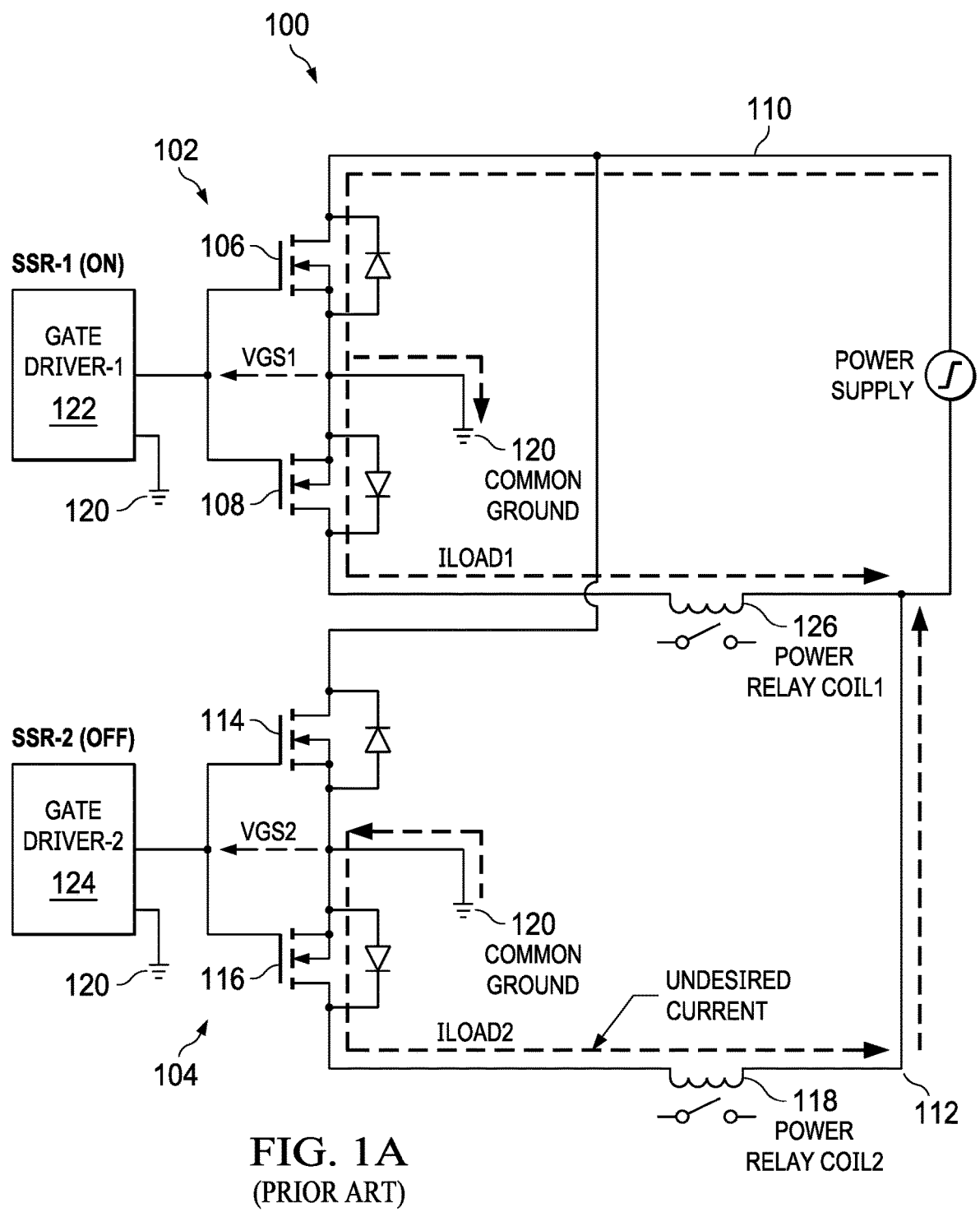
FIG. 1A shows a schematic level diagram for an example multi-channel solid-state relay circuit with a common ground power supply that exhibits unintended turn on of a solid-state relay caused by current flowing through a common ground.

When the gate terminals of the switching metal oxide solid-state field effect transistors (MOSFETs) of multiple solid-state relays with a common ground are driven from a single power supply, current circulates through ground and may unintentionally turn on solid-state relays that are intended to be off. FIG. 1A shows an example of multi-channel solid-state relay circuit 100. The multi-channel solid-state relay circuit 100 includes a solid-state relay 102 and a solid-state relay 104. The solid-state relay 102 and the solid-state relay 104 share a common ground 120. The solid-state relay 102 includes a MOSFET 106 and a MOSFET 108. The solid-state relay 104 includes a MOSFET 114 and a MOSFET 116. The solid-state relay 102 is turned on by activating the gates of MOSFET 106 and the MOSFET 108, and is turned off by deactivating the gates of MOSFET 106 and the MOSFET 108, via the gate driver-122. Similarly, the solid-state relay 104 is turned on by activating the gates of MOSFET 114 and the MOSFET 116, and is turned off by deactivating the gates of MOSFET 114 and the MOSFET 116 via the gate driver 124. The common ground 120 is used as the reference at the gate driver-122 to turn on and turn off the MOSFETs 106 and 108 of the solid-state relay 102. The common ground 120 is also used as the reference at the gate driver 124 to turn on and turn off the MOSFETs 114 and 116 of the solid-state relay 104. The activation gate voltage of MOSFET 106 and 108 are marked as VGS1 (voltage at the gate terminal of MOSFET measured from the source terminal of MOSFET), and the activation gate voltage of MOSFET 114 and 116 are marked as VGS2 (voltage at the gate terminal of MOSFET measured from the source terminal of MOSFET). When the solid-state relay 102 is turned on and the solid-state relay 104 is turned off, a path for current flow is established from the output terminal 110 through the MOSFET 106, the common ground 120, the body diode of the MOSFET 116, and coil 118 coupled to the MOSFET 116 to the output terminal 112. Thus, in the multi-channel solid-state relay circuit 100, current flow is provided to the coil 118 coupled to the MOSFET 116 through the anti-parallel body diode of MOSFET 116 even though the solid-state relay 104 is deactivated (turned off).

Figure 1B:
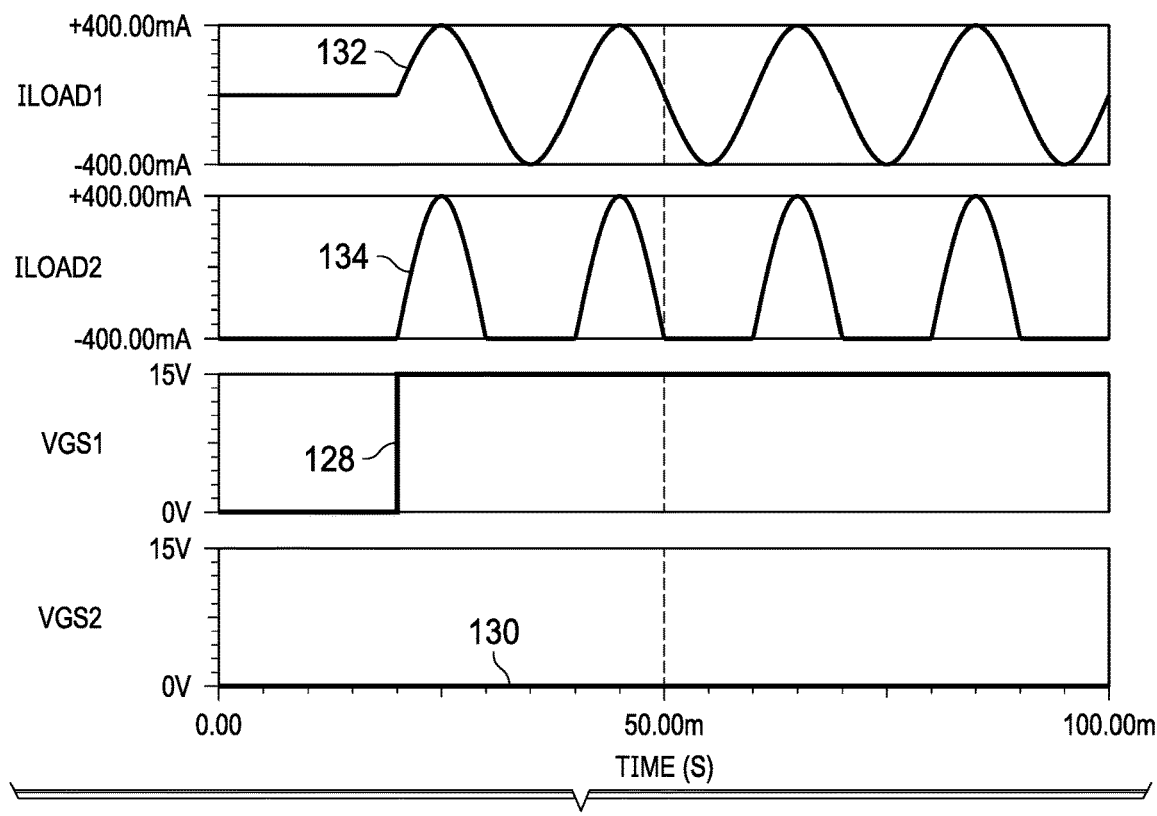
FIG. 1B shows an example of current flow in the multi-channel solid state relay circuit of FIG. 1A.

FIG. 1B shows an example of current flow in the multi-channel solid state relay circuit of FIG. 1A. FIG. 1B shows the gate-source voltage 128 of the MOSFETs 106 and 108, the gate-source voltage 130 of the MOSFETs 114 and 116, current 132 flowing in the coil 126, and current 134 flowing in the coil 118. As explained above, current flowing through the common ground 120 flows through the body diode of the MOSFET 116 and energizes the coil 118 even though the gate-source voltage 130 of the MOSFET 116 is turning off the MOSFET 116.

To alleviate this problem, some multi-channel solid-state relay circuits include a different isolated gate drive power supply for each solid-state relay. Using this solution, a six-channel solid-state relay circuit would include six different isolated gate drive power supplies, one isolated power supply for each solid-state relay channel. Alternatively, each SSR channel can be driven by separate isolated gate drive transformer or separate isolated photo voltaic gate drivers. The inclusion of an individual isolated gate drive power supply per each solid-state relay channel increases circuit area and cost.

The multi-channel solid-state relay circuits described herein include a single isolated power supply and a multi-channel isolator circuit that drives multiple solid-state relays. In each solid-state relay, a diode is provided to block current flow from ground into the MOSFETs of the solid-state relay. The added diode blocks discharge of the voltage at the gates of the MOSFETs, so a gate discharge circuit is coupled to the gate and source terminals the MOSFETs to enable discharge of gate voltage. A high-impedance voltage translation circuit is provided between the isolator and each output switch to ensure high impedance between the power supply and the MOSFET gate, and high impedance between the isolator and MOSFET gate in the MOSFET gate path when the output of the isolator is deactivating the output switch, thereby reducing or eliminating leakage current that may cause undesired turn on of the solid-state relay.

Figure 2:
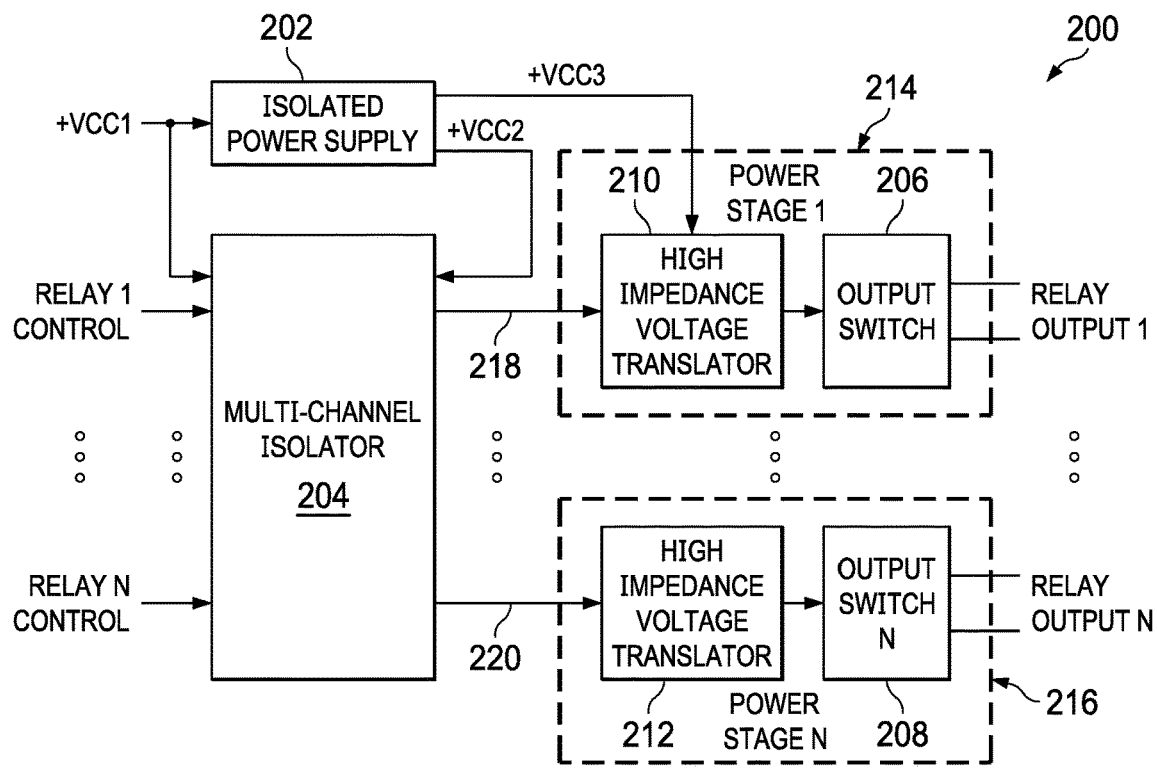
FIG. 2 shows a block diagram for an example multi-channel solid-state relay circuit with a multi-channel isolator as described herein.

FIG. 2 shows a block diagram for an example multi-channel solid-state relay circuit 200. The multi-channel solid-state relay circuit 200 includes an isolated power supply 202, a multi-channel isolator 204, a power stage 214, and a power stage 216. The power stage 214 further includes a high impedance voltage translator 210, and an output switch 206. The power stage 216 includes a high impedance voltage translator 212, and an output switch 208. In practice, the multi-channel solid-state relay circuit 200 includes two or more isolator channels and two or more power stages. The isolated power supply 202 generates the voltages and ground for operation of the multi-channel isolator 204, the power stage 214 and the power stage 216. The power stage 214 is controlled via a first channel of the multi-channel isolator 204, and the power stage 216 is controlled via an Nth channel of the multi-channel isolator 204. The power stage 214 controls the relay output 1 by turning on or turning off the output switch 206 according to the relay control signal 218 generated by the multi-channel isolator 204. Power stage 216 controls the relay output N by turning on or turning off the output switch 208 according to the relay control signal 220 generated by the multi-channel isolator 204. The output switch 206 and output switch 208 control external devices or load in a variety of applications. For example, in a heating, ventilation, and air conditioning (HVAC) system, the multi-channel solid-state relay circuit 200 energize the coils of high-power electromechanical relays that activate fans, compressors, etc. The multi-channel isolator 204 is an electrical isolation device implemented using an analog isolator or digital isolator with a capacitive, inductive, optical, or other isolation technology.

The power stage 214 and the power stage 216 include circuitry that prevents unintended activation of one of the output switch 206 or the output switch 208 when the other of the output switch 206 or the output switch 208 is activated by blocking current flow through the ground shared by the output switch 206 and the output switch 208. Accordingly, the circuit area needed to implement the multi-channel solid-state relay circuit 200 is smaller than that needed in other implementations of a multi-channel solid-state relay circuit.

Figure 3:
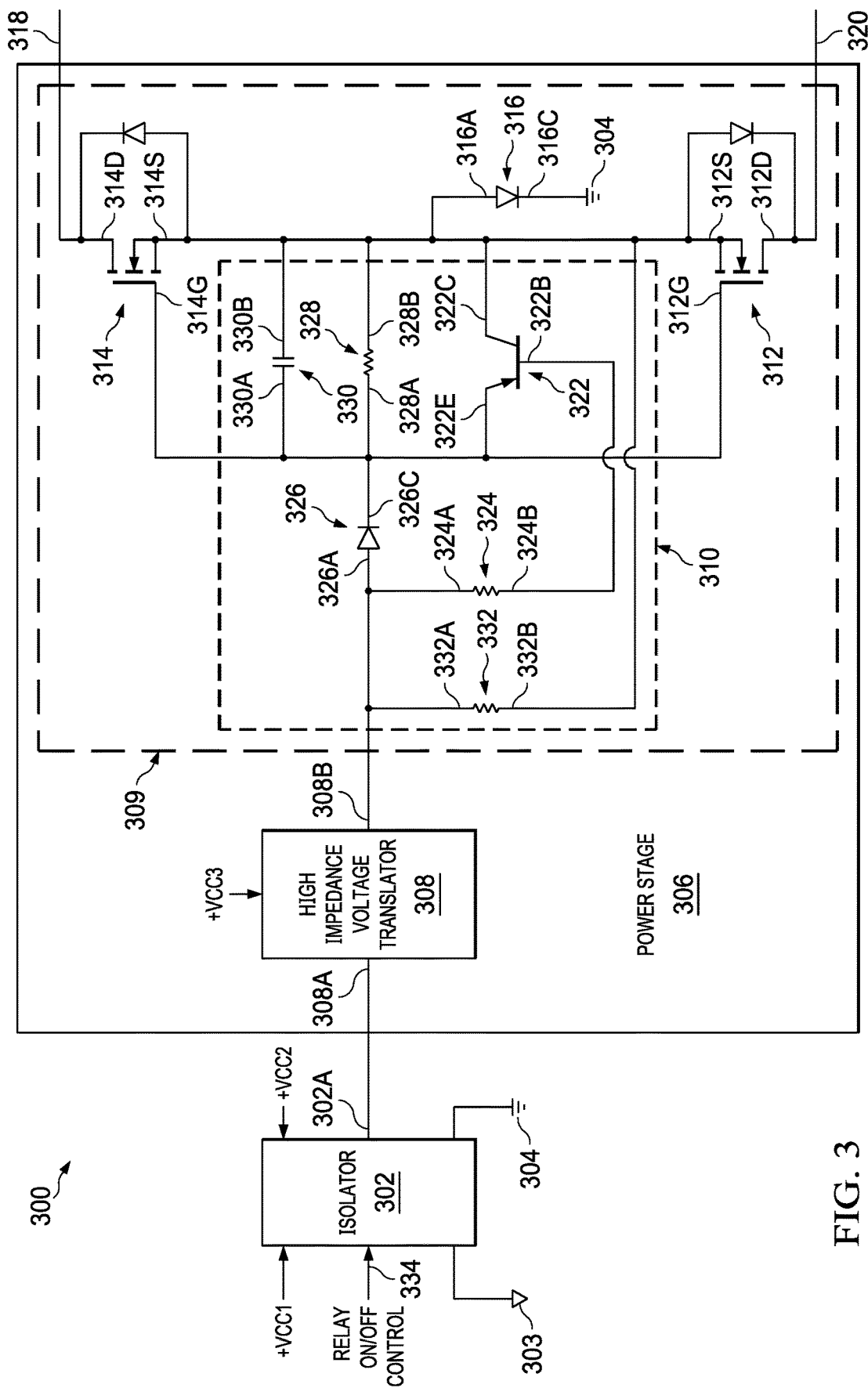
FIG. 3 shows an example schematic level diagram for a solid-state relay circuit in accordance with this description.

FIG. 3 shows an example schematic level diagram for a solid-state relay circuit 300 in accordance with this description. The solid-state relay circuit 300 is an implementation of a solid-state relay channel of the multi-channel solid-state relay circuit 200. The solid-state relay circuit 300 includes an isolator circuit 302, a power stage 306, an output terminal 318, and an output terminal 320. In implementations of the solid-state relay circuit 300, the output terminal 318 serves as either a power supply input or a load output, and the output terminal 320 serves as the other of the power supply input and the load output. The isolator circuit 302 is an implementation of a channel of the multi-channel isolator 204, and the power stage 306 is an implementation of the power stage 214 or the power stage 216. Input circuitry of the isolator circuit 302 is powered by a power supply referenced to a first ground 303, and output circuitry of the isolator circuit 302 is powered by a power supply referenced to the ground 304. An output terminal 302A of the isolator circuit 302 is coupled to the power stage 306 for provision of a relay control signal to the power stage 306.

The power stage 306 includes a high impedance voltage translation circuit 308 and an output switch 309. The output switch 309 is an implementation of the output switch 206 or the output switch 208, and includes a gate discharge circuit 310, a transistor 312, a transistor 314, and a diode 316. The output switch 309 is coupled to the isolator circuit 302. The isolator circuit 302 activates and deactivates the output switch 309 (e.g., the transistors 312 and 314)). A drain terminal 314D of the transistor 314 is coupled to the output terminal 318, and drain terminal 312D of the transistor 312 is coupled to the output terminal 320. A source terminal 314S of the transistor 314 is coupled to a source terminal 312S of the transistor 312. A gate terminal 314G of the transistor 314 and a gate terminal 312G of the transistor 312 are coupled to an output terminal 302A of the isolator circuit 302 via the gate discharge circuit 310 and the high impedance voltage translation circuit 308. The transistor 312 and the transistor 314 are N-channel MOSFETs in some implementations of the solid-state relay circuit 300.

The diode 316 includes a cathode terminal 316C coupled to the ground 304, and an anode terminal 316A coupled to the source terminal 312S of the transistor 312 and the source terminal 314S of the transistor 314. The diode 316 allows current to flow from the source terminal 314S of the transistor 314 and the source terminal 312S of the transistor 312 to ground 304 and blocks current flow from ground 304 to the source terminal 314S of the transistor 314 and the source terminal 312S of the transistor 312. As explained with regard to FIG. 1, current flow from ground through the MOSFET 116 (which corresponds to the transistor 312 of the solid-state relay circuit 300) may unintentionally activate equipment controlled by the solid-state relay. The diode 316 blocks such current flow to prevent unintentional activation of external equipment when the power stage 306 is turned off. The diode 316 is implemented as a diode-connected transistor in some implementations of the power stage 306.

The gate discharge circuit 310 is coupled to the transistor 312 and the transistor 314 to discharge the gates of the transistors 312 and 314, and thereby turn off the transistors 312 and 314 when the relay control signal 334 directs deactivation of the solid-state relay circuit 300. The gate discharge circuit 310 shunts voltage at the gate terminal 314G of the transistor 314 and at the gate terminal 312G of the transistor 312 to the source terminal 314S of the transistor 314 and the source terminal 312S of the transistor 312. The gate discharge circuit 310 includes a discharge transistor 322, a resistor 324, a diode 326, a resistor 328, a capacitor 330, and a resistor 332. The diode 326 allows current flow to activate the transistor 312 and the transistor 314 and blocks discharge of voltage at the gate terminal 314G of the transistor 314 and the gate terminal 312G of the transistor 312. The diode 326 includes an anode terminal 326A coupled to the output terminal 302A of the isolator circuit 302 via the high impedance voltage translation circuit 308, and a cathode terminal 326C coupled to the gate terminal 314G of the transistor 314 and the gate terminal 312G of the transistor 312. Current flows through the diode 326 to charge the gate terminal 314G of the transistor 314 and the gate terminal 312G of the transistor 312. The resistor 328 includes a terminal 328A coupled to the gate terminal 314G of the transistor 314 and the gate terminal 312G of the transistor 312, and a terminal 328B coupled to the source terminal 314S of the transistor 314 and the source terminal 312S of the transistor 312. The resistor 328 provides a path for discharging voltage on the gate terminal 314G of the transistor 314 and the gate terminal 312G of the transistor 312. The capacitor 330 is in parallel with resistor 328 to suppress noise at the gate terminal 312G of the transistor 312 and the gate terminal 314G of the transistor 314. A terminal 330A of the capacitor 330 is coupled to the terminal 328A of the resistor 328 and a terminal 330B of the capacitor 330 is coupled to the terminal 328B of the resistor 328.

The discharge transistor 322 is connected in parallel with the resistor 328 to increase the rate of gate voltage discharge. The discharge transistor 322 is a PNP bipolar junction transistor in some implementations of the gate discharge circuit 310. A collector terminal 322C of the discharge transistor 322 is coupled to the source terminal 312S of the transistor 312 and the source terminal 314S of the transistor 314. The emitter terminal 322E of the discharge transistor 322 is coupled to the gate terminal 314G of the transistor 314 and the gate terminal 312G of the transistor 312. The base terminal 322B of the discharge transistor 322 is coupled to the anode terminal 326A of the diode 326 via the resistor 324, and to the output terminal 302A of the isolator circuit 302. The resistor 324 includes a terminal 324A coupled to the anode terminal 326A of the diode 326 and the output terminal 302A of the isolator circuit 302, and terminal 324B coupled to the base terminal 322B of the discharge transistor 322. When the output of the isolator circuit 302 is active (logic high) to turn on the transistor 312 and the transistor 314, the discharge transistor 322 is turned off, and the gate terminal 312G of the transistor 312 and the gate terminal 314G of the transistor 314 are charged via the diode 326. When the output of the isolator circuit 302 is inactive (logic low) to turn off the transistor 312 and the transistor 314, the discharge transistor 322 is turned on to discharge the gate terminal 312G of the transistor 312 and the gate terminal 314G of the transistor 314.

The resistor 332 provides a path for current flow from the high impedance voltage translation circuit 308 to the source terminal of the transistors 314 and 316. The resistor 332 provides a path for the base current of the discharge transistor 322. The base current of the discharge transistor 322 flows from the emitter terminal 322E, to the base terminal 322B, through the resistor 324, through the resistor 332, through the source terminals 314S and 312S of the transistors 314 and 312, through the gate terminals 314G and 312G of the transistors 314 and 312 and to the emitter terminal 322E. The resistor 332 includes a terminal 332A coupled to the anode terminal 326A of the diode 326 and a terminal 332B coupled to the source terminal 312S of the transistor 312.

The high impedance voltage translation circuit 308 couples the isolator circuit 302 to the gate discharge circuit 310. The high impedance voltage translation circuit 308 boosts the voltage of the signal driving the transistor 312 and the transistor 314, and provides a high impedance in the path to the gate terminal 312G and the gate terminal 314G when the output signal of isolator circuit 302 is deactivating the transistor 312 and the transistor 314. The high impedance presented by the high impedance voltage translation circuit 308 reduces or eliminates leakage current that may unintentionally turn on the transistor 312 and the transistor 314.

Figure 4:
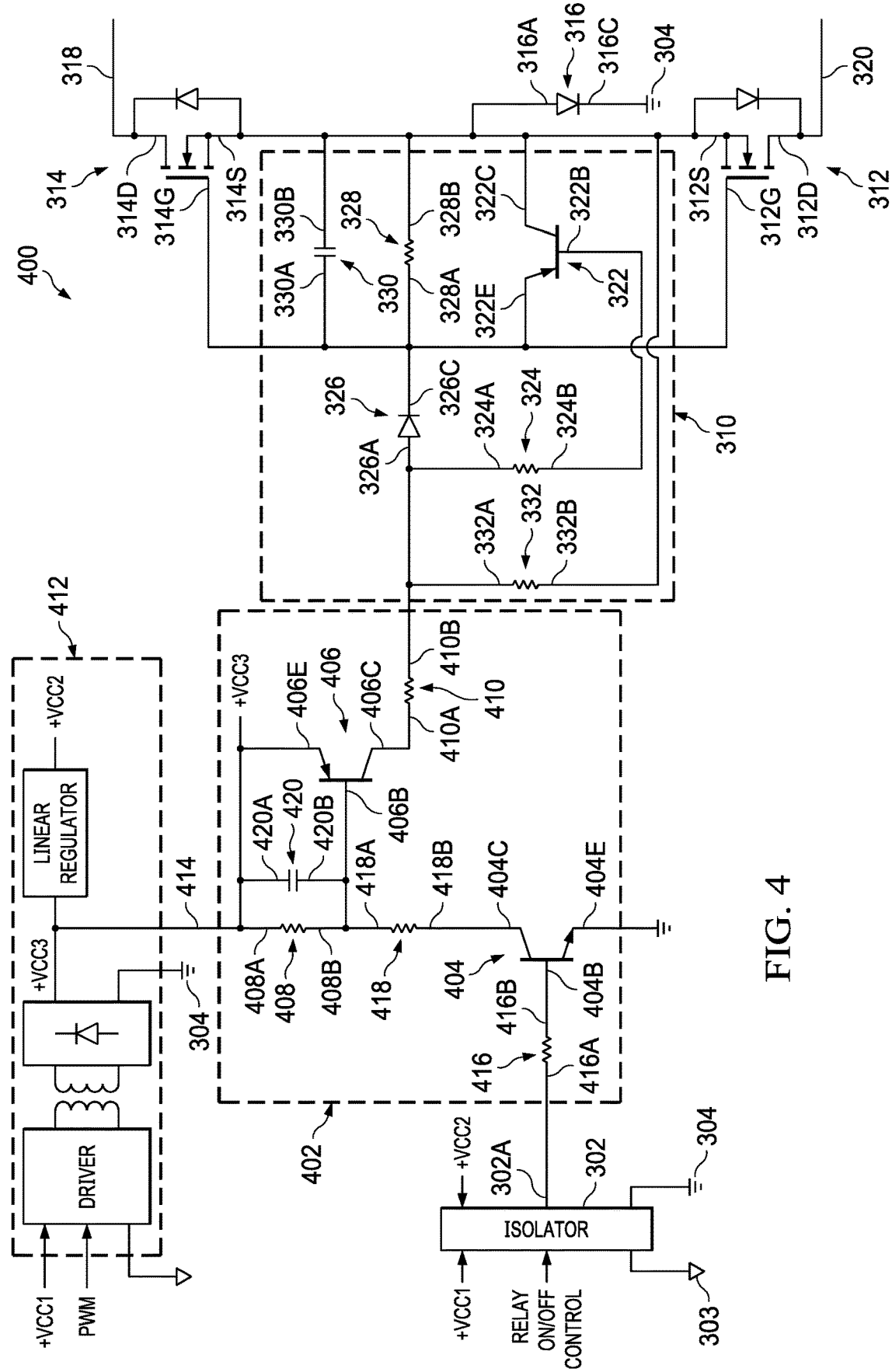
FIG. 4 shows an example schematic level diagram for a high impedance voltage translation circuit in a solid-state relay circuit in accordance with this description.

FIG. 4 shows an example schematic level diagram for a high impedance voltage translation circuit in a solid-state relay circuit 400 in accordance with this description. The solid-state relay circuit 400 is an implementation of the solid-state relay circuit 300 and includes a high impedance voltage translation circuit 402. The high impedance voltage translation circuit 402 is an implementation of the high impedance voltage translation circuit 308. FIG. 4 also includes a block diagram for an isolated power supply 412. The isolated power supply 412 generates a lower voltage (+VCC2, for example+3.3V or +5V) that powers the isolator circuit 302, and higher voltage (+VCC3, for example+10V or +12V) that powers the high impedance voltage translation circuit 402. The voltage level of +VCC3 is selected based on the gate-to-source voltage needed to turn on the transistor 314 and the transistor 312. The output voltages of the isolated power supply 412 are referenced to the ground 304. The high impedance voltage translation circuit 402 provides a high impedance between the isolator circuit 302 (when the isolator output is logic low) and the two gate terminals 312G/314G of the transistors 312/314, and provides a high impedance between the power supply 412 and the two gate terminals 312G/314G of the transistors 312/314.

The high impedance voltage translation circuit 402 includes a transistor 404, a transistor 406, a resistor 408, a resistor 410, a resistor 418, a capacitor 420, and resistor 416. The transistor 404 is coupled to the isolator circuit 302 via the resistor 416. The resistor 416 limits the base current of the transistor 404. The transistor 404 includes a base terminal 404B coupled to a terminal 416B of the resistor 416, and to the output terminal 302A of the isolator circuit 302 via the resistor 416. A terminal 416A of the resistor 416 is coupled to the output terminal 302A of the isolator circuit 302, and an emitter terminal 404E of transistor 404 is coupled to the ground 304. The transistor 404 is an NPN bipolar junction transistor in some implementations of the high impedance voltage translation circuit 402. A collector terminal 404C of the transistor 404 is coupled to the isolated power supply 412 via the resistors 408 and 418, and to the base terminal 406B of the transistor 406 via the resistor 418. The resistor 408 includes a terminal 408A coupled to the isolated power supply 412 and the emitter terminal 406E of the transistor 406, and a terminal 408B coupled to the terminal 418B of the resistor 418 and the base terminal 406B of the transistor 406. Terminal 418A of the resistor 418 is coupled to the collector terminal 404C of the transistor 404.

The transistor 404 activates (drives) the transistor 406, via the resistor 418, responsive to the signal output by the isolator circuit 302. The resistor 418 limits the base current of the transistor 406. The transistor 406 drives the gate terminals 314G and 312G of the transistor 312 and the transistor 314 and the gate discharge circuit 310 to the higher voltage generated by the isolated power supply 412. The transistor 406 is a PNP bipolar junction transistor in some implementations of the high impedance voltage translation circuit 402. A base terminal 406B of the transistor 406 is coupled to the terminal 418B of the resistor 418 and the output terminal 302A of the isolator circuit 302. The capacitor 420 is connected in parallel with resistor 408 to suppress noise at the base terminal 406B of the transistor 406. Terminal 420A of the capacitor 420 is coupled to the terminal 408A of the resistor 408, and the terminal 420B is coupled to the terminal 408B of the resistor 408.

An emitter terminal 406E of the transistor 406 is coupled to the terminal 408A of the resistor 408 and the power supply terminal 414 for receiving the higher voltage generated by the isolated power supply 412. The transistor 406 drives the gate discharge circuit 310 via the resistor 410. The resistor 410 includes a terminal 410A coupled to the collector terminal 406C of the transistor 406, and a terminal 410B coupled to the anode terminal 326A of the diode 326 and to the gate terminal 314G of the transistor 314 via the diode 326. The collector terminal 406C of the transistor 406 is coupled to the gate terminal 314G of the transistor 314 via the resistor 410 and the diode 326. The collector impedance of the transistor 406 is high when the transistor 406 is turned off to reduce or eliminate flow of leakage current from the high impedance voltage translation circuit 402 to the transistor 312 and the transistor 314, thereby preventing unintended activation of the transistor 312 and the transistor 314.

Figure 5:
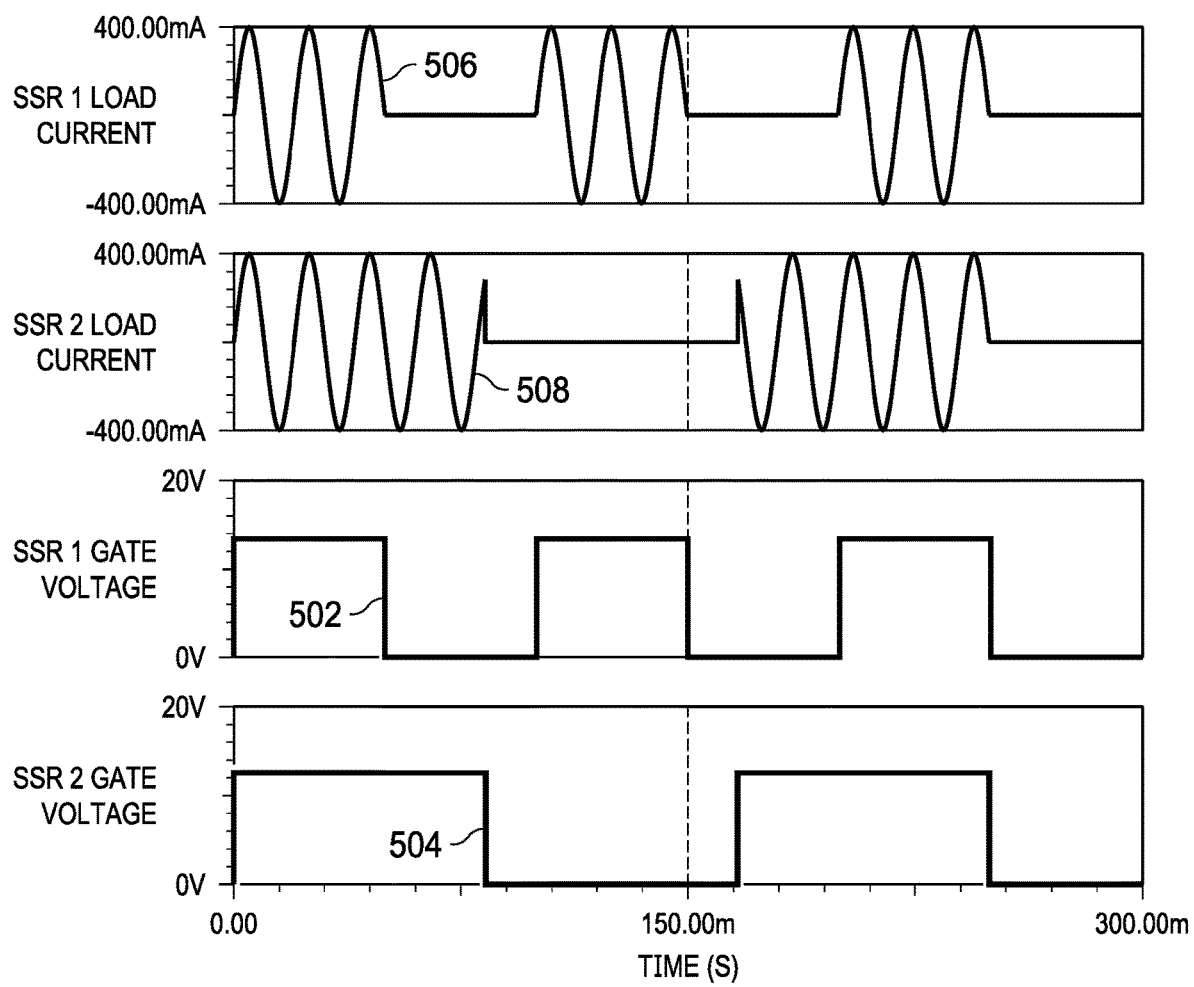
FIG. 5 shows an example of current flow in solid-state relays of a multi-channel solid-state relay circuit in accordance with this description.

FIG. 5 shows an example of current flow in solid-state relays of the multi-channel solid-state relay circuit 200. The signal 502 is the voltage applied to the gate terminal 312G and gate terminal 314G in a first instance of the power stage 306 (e.g., the output switch 206 of the power stage 214), and the signal 504 is the voltage applied to the gate terminal 312G and the gate terminal 314G in a second instance of the power stage 306 (e.g., the output switch 208 of the power stage 216). The signal 502 and 504 have defined high and low voltage levels sufficient to turn on and turn off the transistors 312 and 314 of the output switch 309. The signal 506 is the current flowing in the output terminal 320 of the first instance of the power stage 306 (e.g., the power stage 214), and the signal 508 is the current flowing in the output terminal 320 of the second instance of the power stage 306 (e.g., the power stage 216). As shown in FIG. 5, activation of the power stage 214, via the signal 502, does not inadvertently activate the power stage 216, and activation of the power stage 216, via the signal 504, does not inadvertently activate the power stage 214 because the diode 316 blocks flow of current through ground 304 that would allow unintended activation. Also, the high impedance presented by the high impedance voltage translation circuit 308 reduces or eliminates leakage current that may unintentionally turn on the transistor 312 and the transistor 314. The high impedance voltage translator prevents unintentional activation of output switch 206, when the signal 502 is logic low, by eliminating possible leakage current that would have happened when the output switch 208 is activated.

Figure 6:
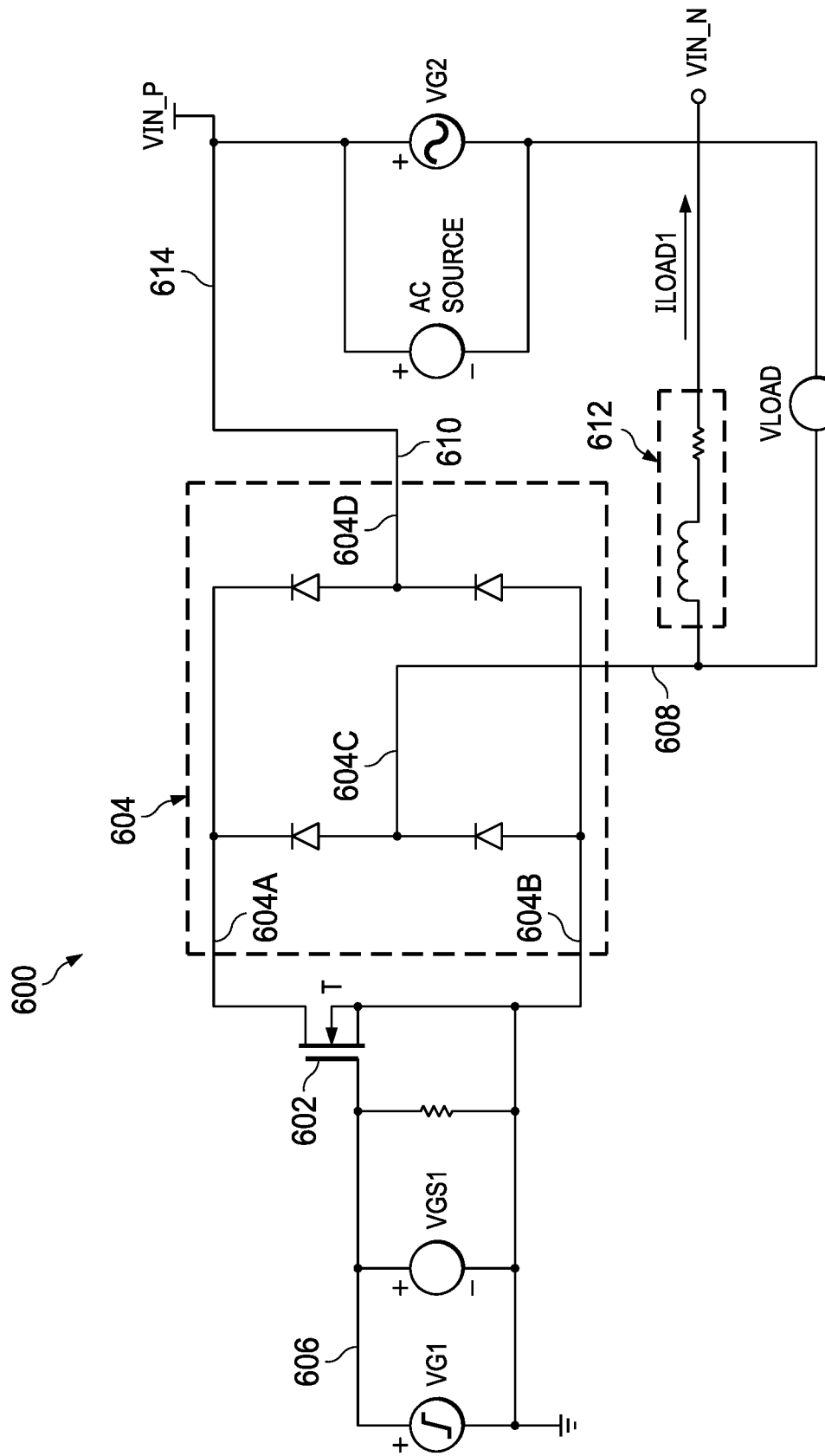
FIG. 6 shows a schematic level diagram for an example solid state relay circuit that lacks control over turn-off voltage spikes.

In some solid-state relays, if the solid-state relay is turned off arbitrarily, a spike may be generated on the load voltage. The voltage spike may exceed the maximum voltage generated by the power supply switched to the load. In some cases, the spike may be large enough to damage the load circuit or the switching components of the solid-state relay. FIG. 6 shows a schematic level diagram for an example solid state relay circuit 600 that lacks control over turn-off voltage spikes. The solid-state relay circuit 600 includes a transistor 602, a diode bridge 604, an output terminal 608, an output terminal 610, and a control terminal 606. Signal VG1 at the control terminal 606 turns the solid-state relay circuit 600 on and off by turning the transistor 602 on and off. Turning the transistor 602 on enables current flow in the diode bridge 604 to drive the load circuit 612. Turning off the transistor 602 disables current flow in the diode bridge 604. The diode bridge 604 includes a terminal 604A coupled to the drain terminal of the transistor 602, a terminal 604B coupled to the source terminal of the transistor 602, a terminal 604C coupled to the output terminal 608 and the load circuit 612, and a terminal 604D coupled to the output terminal 610 and the power terminal 614. In the solid-state relay circuit 600, the timing of turn off is arbitrary, and a spike on the load voltage may be generated when the solid-state relay circuit 600 is turned off.

Figure 7:
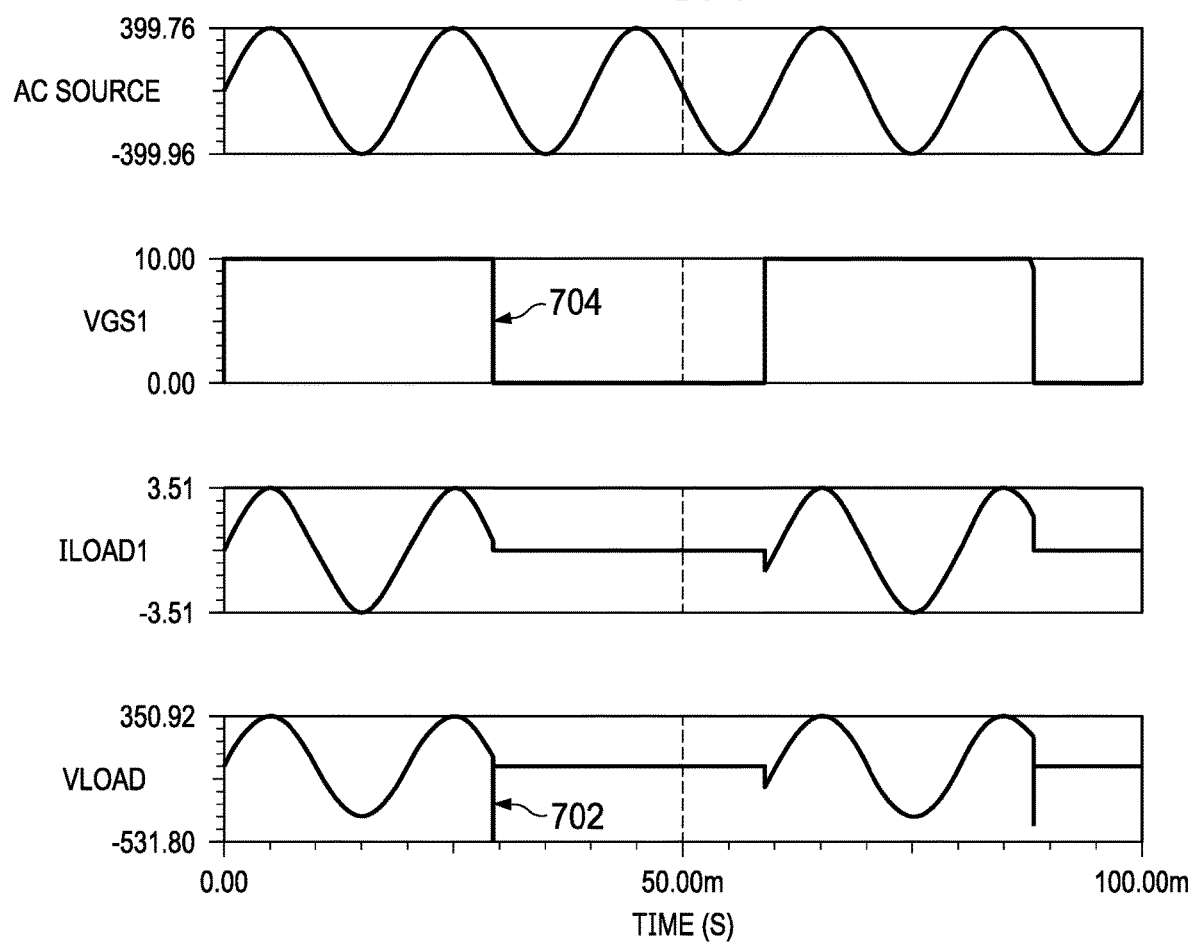
FIG. 7 shows an example of a spike in the load voltage of the solid-state relay circuit of FIG. 6.

FIG. 7 shows an example of a spike 702 on the load voltage of the solid-state relay circuit 600. The signal VG1 turns the solid-state relay circuit 600 on and off. At the edge 704 of the signal VG1, the solid-state relay circuit 600 is turned off. The current (ILOAD) flowing in the load circuit 612 is non-zero at the edge 704. Turning off the solid-state relay circuit 600 with current flowing in the load circuit 612 causes the spike 702. The voltage (VLOAD) across the load circuit 612 is about +/−350 volts maximum in normal operation, and that is approximately equal to the voltage level of the AC voltage source VG2. The spike 702 is about −531 volts and may damage the load circuit 612 or the solid-state relay circuit 600.

Figure 8:
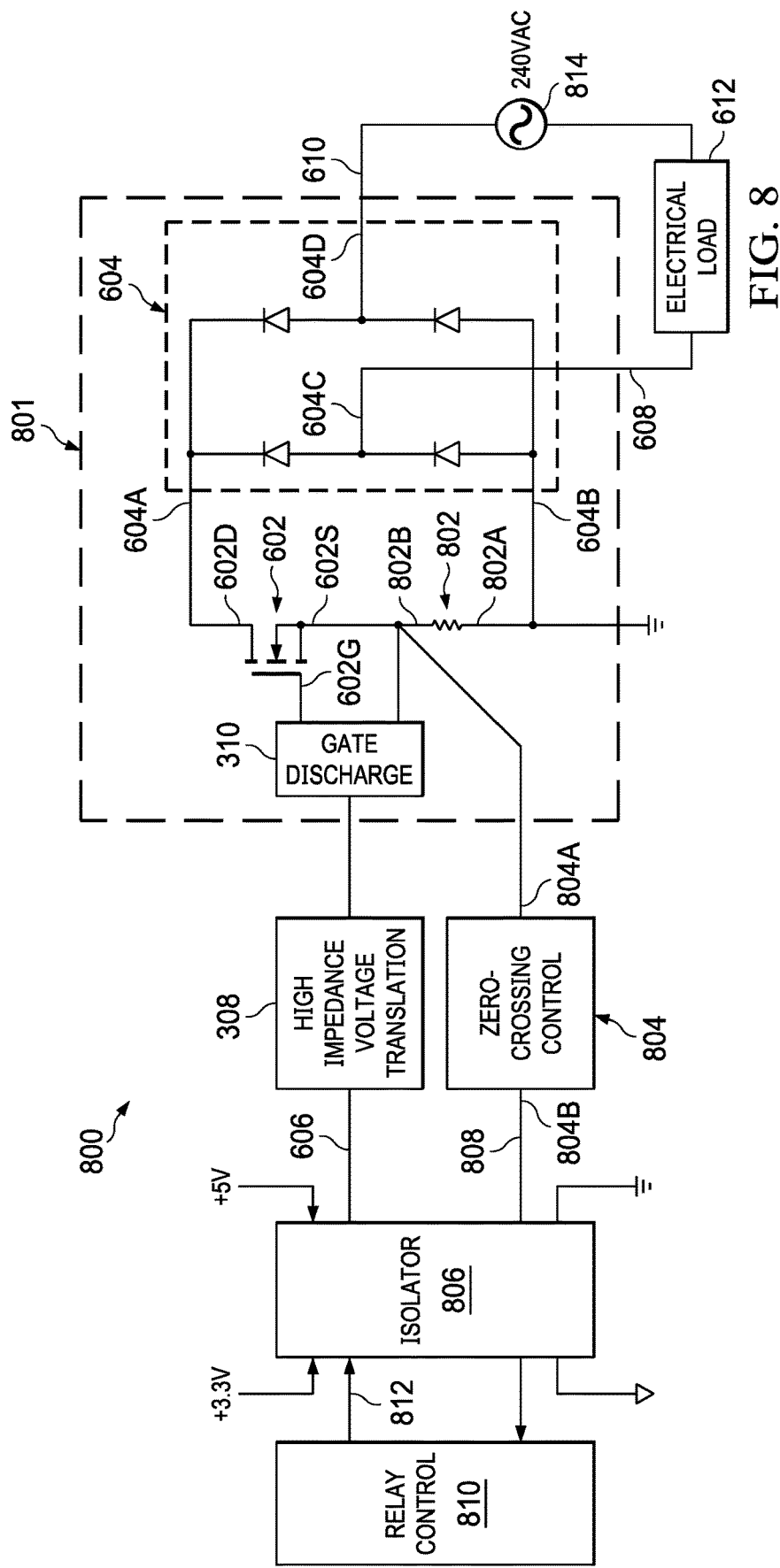
FIG. 8 shows a block diagram for a solid-state relay circuit that includes zero-crossing control circuitry to suppress spikes in the load voltage.

FIG. 8 shows a block diagram for a solid-state relay circuit 800 that includes zero-crossing control circuitry to suppress spikes in the load voltage. The solid-state relay circuit 800 detects zero-crossings in the load current to control turn-off of the solid-state relay circuit 800 based on zero-current flow in the load circuit 612. The solid-state relay circuit 800 includes an output switch 801, a zero-crossing control circuit 804, the high impedance voltage translation circuit 308, and an isolator circuit 806. The isolator circuit 806 is an implementation of the isolator circuit 302 that provides two-way isolation.

The output switch 801 includes the transistor 602, the diode bridge 604, the gate discharge circuit 310, and a current sense resistor 802. The transistor 602 is coupled to the isolator circuit 806 via the high impedance voltage translation circuit 308 and the gate voltage circuit 310 to turn the solid-state relay circuit 800 on and off. The gate terminal 602G of the transistor 602 is coupled to the gate discharge circuit 310. The drain terminal 602D of the transistor 602 is coupled to the terminal 604A of the diode bridge 604. The source terminal 602S of the transistor 602 is coupled to a terminal 802B of the current sense resistor 802. A terminal 802A of the current sense resistor 802 is coupled to the terminal 604B of the diode bridge 604.

The voltage across the current sense resistor 802 represents the current flowing through the load circuit 612. The zero-crossing control circuit 804 includes an input terminal 804A coupled to the terminal 802B of the current sense resistor 802. The zero-crossing control circuit 804 detects the zero crossings in the voltage across the current sense resistor 802 to identify zero crossings in the current flowing in the load circuit 612. For example, an implementation of the zero-crossing control circuit 804 includes a comparator that compares the rectified voltage at the terminal 802B of the current sense resistor 802 to a threshold voltage to identify zero crossings. The zero-crossing control circuit 804 is coupled to a relay control circuit 810 via the isolator circuit 806, and coupled to the gate terminal 602G of the transistor 602 via the isolator circuit 806 and the relay control circuit 810. The zero-crossing control circuit 804 includes an output terminal 804B coupled to the isolator circuit 806. The relay control circuit 810 synchronizes turn off of the solid-state relay circuit 800 to the zero-crossing signal 808 generated by the zero-crossing control circuit 804 to avoid spikes in the voltage across the load circuit 612. That is, a relay control signal 812 generated by the relay control circuit 810, and provided, via the isolator circuit 806, at the control terminal 606 is synchronized to the zero-crossing signal 808 for turning off the solid-state relay circuit 800. The synchronization of the zero cross signal and the relay turn off is done in the low voltage side (e.g., by the relay control circuit 810 on the primary side of the isolator circuit 806).

Figure 9:
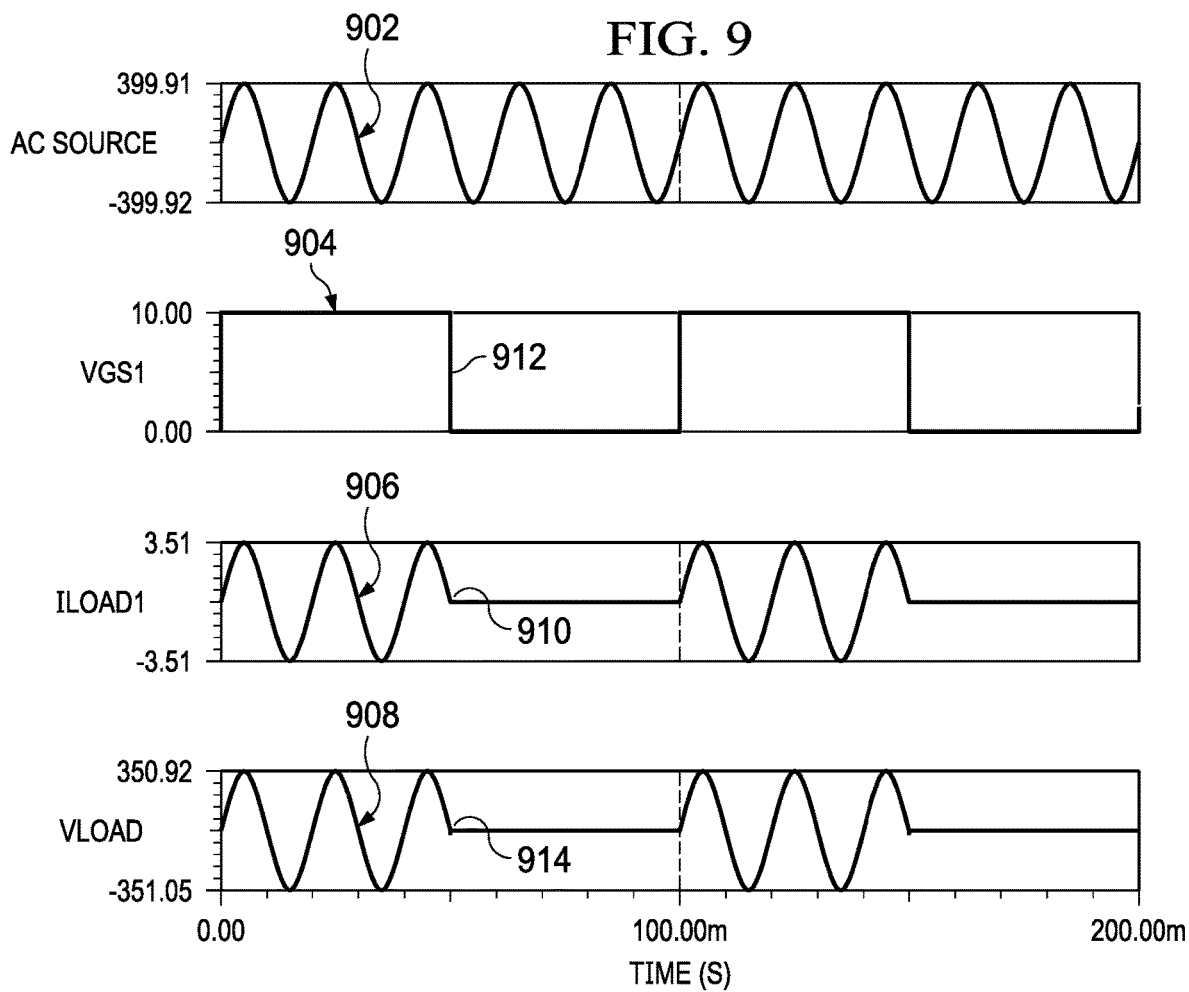
FIG. 9 shows signals generated in the solid-state relay circuit of FIG. 8.

FIG. 9 shows example signals generated in the solid-state relay circuit 800. In FIG. 9, the voltage 902 provided by the source 814, the control voltage 904 applied to control the transistor 602 to turn the solid-state relay circuit 800 on and off, the current 906 flowing in the load circuit 612, and the voltage 908 across the load circuit 612 are shown. The zero-crossing control circuit 804 detects the zero-crossings in the current 906. The relay control circuit 810 turns off the solid-state relay circuit 800 at a zero-crossing of the current 906. Thus, at zero-crossing 910, the control voltage 904 changes state (edge 912) to turn off the solid-state relay circuit 800. Because the solid-state relay circuit 800 is turned off at the zero-crossing 910, a voltage spike is not produced at the instant 914.

Figure 10:
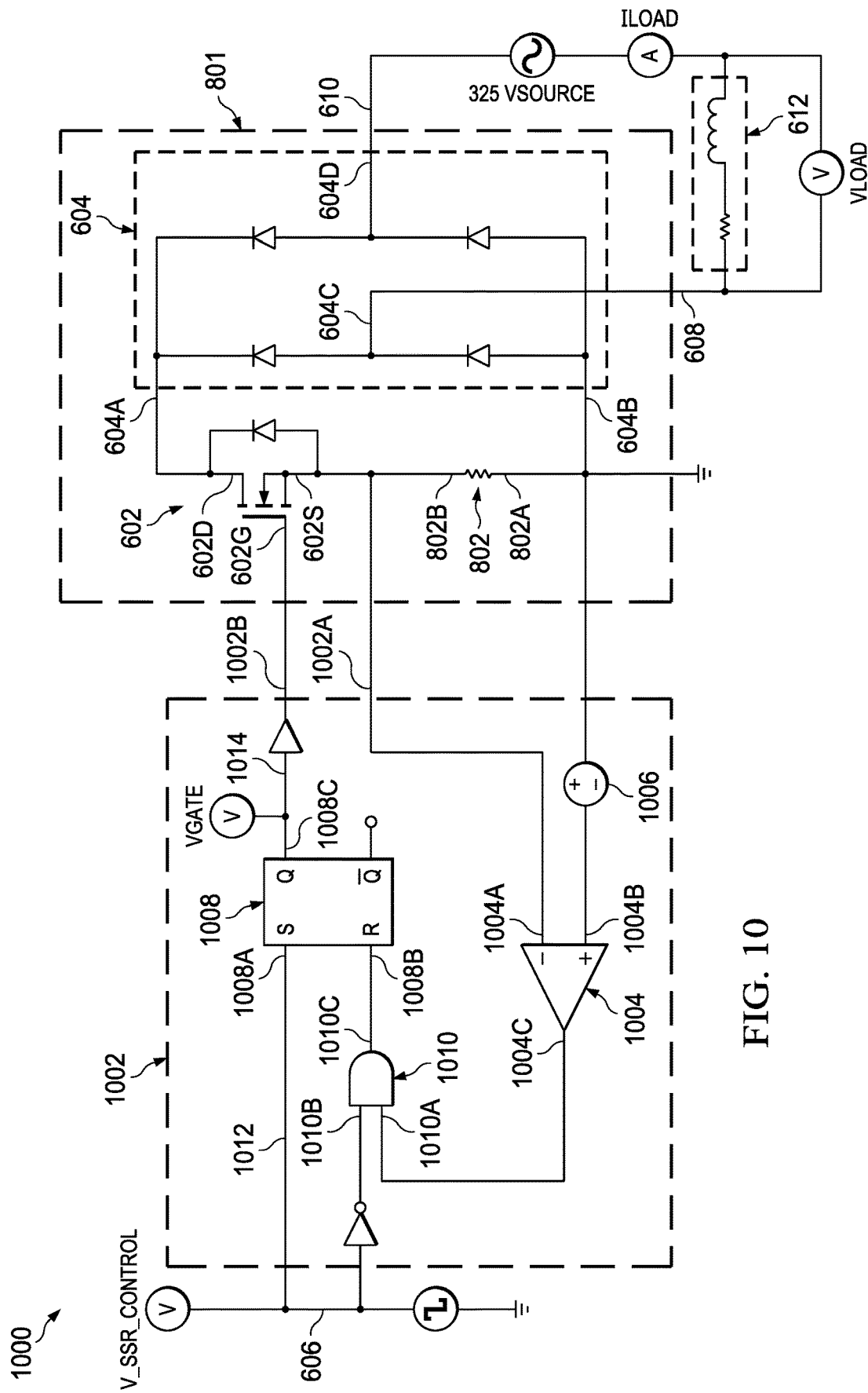
FIG. 10 shows a schematic level diagram for a solid-state relay circuit that includes zero-crossing control circuitry to suppress spikes in the load voltage.

FIG. 10 shows a schematic level diagram for a solid-state relay circuit 1000 that includes zero-crossing control circuitry to suppress spikes in the load voltage. The solid-state relay circuit 1000 includes the output switch 801 and a zero-crossing control circuit 1002. The zero-crossing control circuit 1002 includes an input terminal 1002A, an output terminal 1002B, a comparator 1004, a reference voltage source 1006, a flip-flop 1008, and a logic gate 1010. The input terminal 1002A is coupled to the terminal 802B of the current sense resistor 802. The comparator 1004 compares the voltage at the terminal 802B of the current sense resistor 802 to the reference voltage generated by the reference voltage source 1006 to identify zero-crossings in the current flowing in the load circuit 612. The comparator 1004 includes a terminal 1004A coupled to the terminal 802B of the current sense resistor 802, and a terminal 1004B coupled to the reference voltage source 1006.

The logic gate 1010 gates the relay control signal provided at the control terminal 606 with the output of the comparator 1004 to ensure that the solid-state relay circuit 1000 is turned off at a zero-crossing of the current flowing in the load circuit 612. The logic gate 1010 includes an input terminal 1010A coupled to the output terminal 1004C of the comparator 1004, an input terminal 10106 coupled to the control terminal 606 via an inverter, and an output terminal 1010C coupled to the flip-flop 1008. The flip-flop 1008 includes an input terminal 1008A (set terminal) coupled to the control terminal 606, an input terminal 1008B (reset terminal) coupled to the output terminal 1010C of the logic gate 1010, and an output terminal 1008C coupled to the gate terminal 602G of the transistor 602. The flip-flop 1008 is set to turn on the solid-state relay circuit 800 when the signal at the control terminal 606 is a logic high, and the flip-flop 1008 is reset to turn off the solid-state relay circuit 800 when the signal at the control terminal 606 is a logic low and a zero-crossing is detected. The synchronization of the zero cross signal and relay turn off is done in the same secondary side of isolator. In some circuits, the relay turn off synchronization is performed on the primary side of the isolator circuit (e.g., isolator circuit 806) as shown in FIG. 8, while in other circuits, the relay turn off synchronization is performed on the secondary side of the isolator as shown in FIG. 10.

Figure 11:
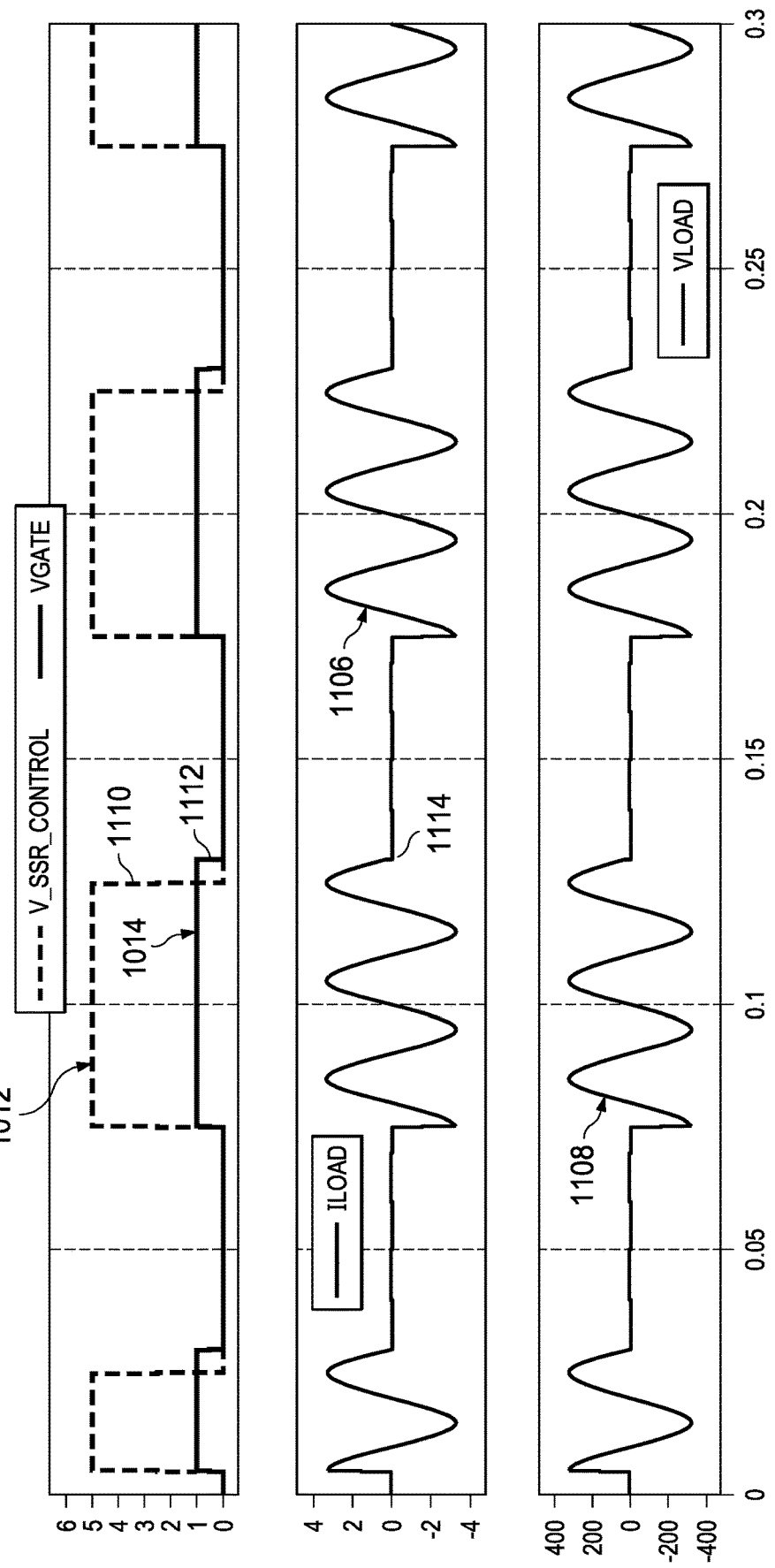
FIG. 11 shows signals generated in the solid-state relay circuit of FIG. 10.

FIG. 11 shows example signals generated in the solid-state relay circuit 1000. The signal 1012 at the control terminal 606, the signal 1014 at the output terminal 1008C of the flip-flop 1008, the current 1106 flowing in the load circuit 612, and the voltage 1108 across the load circuit 612 are shown in FIG. 11. When the signal 1012 transitions to a logic high to turn on the solid-state relay circuit 1000, the signal 1014 transitions to a logic high. When the signal 1012 transitions to a logic low (edge 1110) to turn off the solid-state relay circuit 1000, the signal 1014 transitions to a logic low (edge 1112) at the next detected zero-crossing 1114 of the current 1106. Accordingly, the voltage 1108 across the load circuit 612 goes to zero at a zero-crossing 1114 of the current 1106, and no spike is produced on the voltage 1108 across the load circuit 612.

Figure 12:
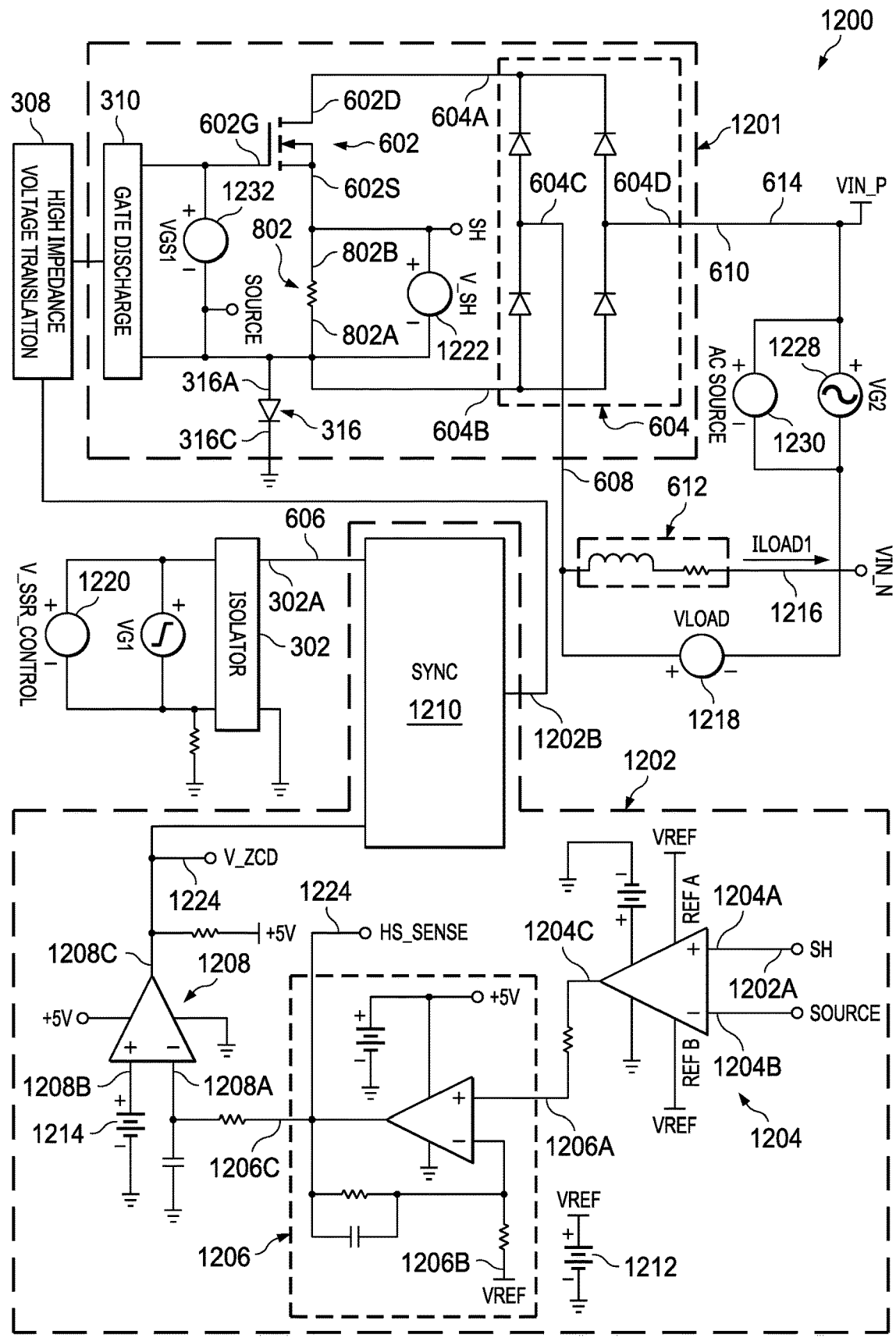
FIG. 12 shows a schematic level diagram for a solid-state relay circuit, in a multi-channel solid-state relay circuit, that includes zero-crossing control circuitry to suppress spikes in the load voltage.

FIG. 12 shows a schematic level diagram for a solid-state relay circuit 1200, part of a multi-channel solid-state relay circuit 200, that includes zero-crossing control circuitry to suppress spikes in the load voltage. The solid-state relay circuit 1200 includes an output switch 1201, a high impedance voltage translation circuit 308, a zero-crossing control circuit 1202, and the isolator circuit 302. The output switch 1201 is an implementation of the output switch 801, and includes the diode 316 to block current flow from ground as described with respect to the solid-state relay circuit 300.

The zero-crossing control circuit 1202 includes an input terminal 1202A, an output terminal 1202B, an amplifier 1204, a level shifter 1206, a comparator 1208, and a synchronization circuit 1210. The input terminal 1202A is coupled to the terminal 802B of the current sense resistor 802. The amplifier 1204 amplifies the voltage across the current sense resistor 802. The amplifier 1204 includes an input terminal 1204A coupled to the terminal 802B of the current sense resistor 802, an input terminal 1204B coupled to the terminal 802A of the current sense resistor 802, and an output terminal 1204C coupled to the level shifter 1206.

The level shifter 1206 shifts the DC level of the output signal of the amplifier 1204. The level shifter 1206 includes an input terminal 1206A, an input terminal 1206B, and an output terminal 1206C. The input terminal 1206A is coupled to the output terminal 1204C of the amplifier 1204. The input terminal 1206B is coupled to a voltage reference 1212. The output terminal 1206C is coupled to the comparator 1208.

The comparator 1208 identifies zero-crossings by comparing output of the level shifter 1206 to a reference voltage. The comparator 1208 includes an input terminal 1208A, an input terminal 1208B, and an output terminal 1208C. The input terminal 1208A is coupled to the output terminal 1206C of the level shifter 1206. The input terminal 1208B is coupled to a reference voltage source 1214. The output terminal 1208C is coupled to the synchronization circuit 1210.

The synchronization circuit 1210 synchronizes turn-off of the solid-state relay circuit 1200 to the zero-crossings in the load current identified by the comparator 1208. One implementation of the synchronization circuit 1210 includes the flip-flop 1008 and the logic gate 1010 arranged as in the solid-state relay circuit 1000.

Figure 13:
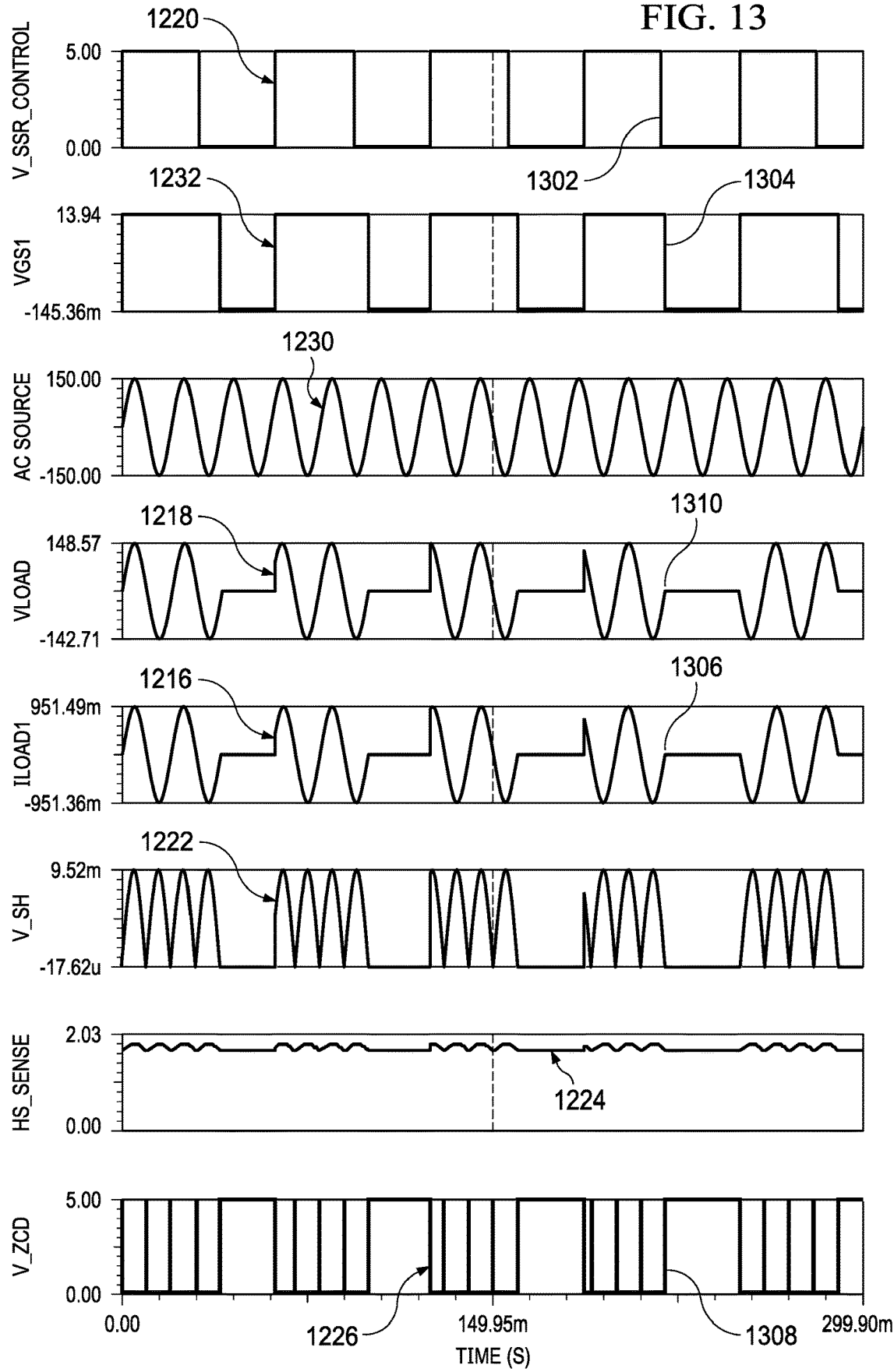
FIG. 13 shows signals generated in the solid-state relay circuit of FIG. 12.

FIG. 13 shows example signals generated in the solid-state relay circuit 1200. In FIG. 13, the voltage 1230 provided by the source 1228, the control signal 1220 applied at the control terminal 606, the synchronized control signal 1232 provided to the transistor 602, the current 1216 flowing in the load circuit 612, the voltage 1218 across the load circuit 612, the voltage 1222 across the current sense resistor 802, the output 1224 of the level shifter 1206, and the zero-crossings detected signal 1226 are shown. The synchronization circuit 1210 applies the zero-crossings detected signal 1226 to synchronize turn off of the solid-state relay circuit 1200 with zero-crossings of the current 1216. At edge 1302 of the control signal 1220, turn off of the 1200 is initiated. The synchronization circuit 1210 synchronizes the control signal 1220 to the zero-crossing 1306 of the current 1216 at edge 1308 of the zero-crossings detected signal 1226 to produce edge 1304 of the synchronized control signal 1232. At edge 1304, the solid-state relay circuit 1200 is turned off at the zero-crossing 1306 of the current 1216. Because the solid-state relay circuit 1200 is turned off at the zero-crossing 1306 a spike is not produced on the voltage 1218 when the voltage 1218 goes to zero at 1310.

Modifications are possible in the described embodiments, and other embodiments are possible, within the scope of the claims.

What is claimed is:

1. A solid-state relay circuit, comprising:
an isolator circuit;
a first output terminal;
a second output terminal;
an output switch coupled to the isolator circuit, and comprising:
  a first transistor comprising:
    a first terminal coupled to the first output terminal; and
    a second terminal coupled to an output terminal of the isolator circuit;
  a second transistor comprising:
    a first terminal coupled to the second output terminal;
    a second terminal coupled to the second terminal of the first transistor; and
    a third terminal coupled to a third terminal of the first transistor; and
  a diode comprising:
    a cathode terminal coupled to ground; and
    an anode terminal coupled to the third terminal of the second transistor;
wherein the output switch comprises:
  a gate discharge circuit comprising:
    a discharge transistor comprising:
      a first terminal coupled to the second terminal of the first transistor;
      a second terminal coupled to the third terminal of the first transistor; and
      a third terminal coupled to the output terminal of the isolator circuit.

2. The solid-state relay circuit of claim 1, wherein the gate discharge circuit further comprises:
a resistor comprising:
  a first terminal coupled to the first terminal of the discharge transistor; and
  a second terminal coupled to the second terminal of the discharge transistor.

3. The solid-state relay circuit of claim 1, wherein:
the diode is a first diode; and
the gate discharge circuit comprises:
  a second diode comprising:
    a cathode terminal coupled to the first terminal of the discharge transistor; and
    an anode terminal coupled to the output terminal of the isolator circuit.

4. The solid-state relay circuit of claim 1, wherein the gate discharge circuit further comprises:
  a resistor comprising:
    a first terminal coupled to the third terminal of the discharge transistor; and
    a second terminal coupled to the output terminal of the isolator circuit.
5. The solid-state relay circuit of claim 1, further comprising:
  a high impedance voltage translation circuit, comprising:
    a third transistor comprising:
      a first terminal coupled to a power supply terminal;
      a second terminal coupled to the output terminal of the isolator circuit; and
      a third terminal coupled to the second terminal of the first transistor.
6. The solid-state relay circuit of claim 5, wherein the high impedance voltage translation circuit, further comprises:
  a fourth transistor comprising:
    a first terminal coupled to the second terminal of the third transistor;
    a second terminal coupled to the output terminal of the isolator circuit; and
    a third terminal coupled to ground.
7. The solid-state relay circuit of claim 5, wherein the high impedance voltage translation circuit, further comprises:
  a resistor comprising:
    a first terminal coupled to the first terminal of the third transistor; and
    a second terminal coupled to the second terminal of the third transistor.
8. The solid-state relay circuit of claim 5, wherein the high impedance voltage translation circuit, further comprises:
  a resistor comprising:
    a first terminal coupled to the third terminal of the third transistor; and
    a second terminal coupled to the second terminal of the first transistor.
9. A solid-state relay circuit, comprising:
  a first output terminal;
  a second output terminal;
  an output switch comprising:
    a first transistor coupled to the first output terminal;
    a second transistor coupled to the first transistor and the second output terminal; and
    a diode coupled to the first transistor, the second transistor, and ground, and configured to block current flow from ground to the first transistor and second transistor; and
  an isolator circuit coupled to the output switch and configured to activate the first transistor and the second transistor.
10. The solid-state relay circuit of claim 9, wherein the output switch comprises a gate discharge circuit configured to shunt voltage at a gate terminal of the first transistor and at a gate terminal of the second transistor to a source terminal of the first transistor and a source terminal of the second transistor.
11. The solid-state relay circuit of claim 10, wherein the gate discharge circuit comprises:
  a discharge transistor comprising:
    a first terminal coupled to the gate terminal of the first transistor and the gate terminal of the second transistor;
    a second terminal coupled to the source terminal of the first transistor and the source terminal of the second transistor; and
    a third terminal coupled to an output terminal of the isolator circuit.
12. The solid-state relay circuit of claim 11, wherein:
the diode is a first diode, and
the gate discharge circuit comprises:
  a second diode configured to pass current to the gate terminal of the first transistor and the gate terminal of the second transistor, and comprising:
    a cathode terminal coupled to the gate terminal of the first transistor and the gate terminal of the second transistor; and
    an anode terminal coupled to the output terminal of the isolator circuit.
13. The solid-state relay circuit of claim 12, further comprising a high impedance voltage translation circuit configured to boost output voltage of the isolator circuit and present a high impedance to the first transistor and the second transistor.
14. The solid-state relay circuit of claim 13, wherein the high impedance voltage translation circuit comprises:
  a third transistor configured to drive the gate terminal of the first transistor and the gate terminal of the second transistor, and comprising:
    a first terminal coupled to a power supply terminal;
    a second terminal coupled to the output terminal of the isolator circuit; and
    a third terminal coupled to the anode terminal of the second diode.
15. The solid-state relay circuit of claim 14, wherein the high impedance voltage translation circuit further comprises:
  a fourth transistor configured to drive the third transistor, and comprising:
    a first terminal coupled to the second terminal of the third transistor;
    a second terminal coupled to the output terminal of the isolator circuit; and
    a third terminal coupled to ground.
16. A solid-state relay circuit, comprising:
  a first output terminal;
  a second output terminal;
  an output switch comprising:
    a first transistor coupled to the first output terminal;
    a second transistor coupled to the first transistor and the second output terminal; and
    a diode coupled to the first transistor, the second transistor, and ground, and configured to block current flow from ground to the first transistor and the second transistor;
  wherein the output switch comprises a gate discharge circuit configured to shunt voltage at a gate terminal of the first transistor and at a gate terminal of the second transistor to a source terminal of the first transistor and a source terminal of the second transistor;
  a high impedance voltage translation circuit coupled to the gate discharge circuit and configured to boost drive voltage to and present a high impedance to the first transistor and the second transistor; and
  an isolator circuit coupled to the high impedance voltage translation circuit and configured to activate or deactivate the output switch.
17. The solid-state relay circuit of claim 16, wherein:
the diode is a first diode; and
the gate discharge circuit comprises:
  a discharge transistor comprising:

a first terminal coupled to the gate terminal of the first transistor and the gate terminal of the second transistor;

a second terminal coupled to the source terminal of the first transistor and the source terminal of the second transistor; and a third terminal coupled to an output terminal of the isolator circuit; and a second diode configured to pass current to the gate terminal of the first transistor and the gate terminal of the second transistor, and comprising:

a cathode terminal coupled to the gate terminal of the first transistor and the gate terminal of the second transistor; and an anode terminal coupled to the output terminal of the isolator circuit.

18. The solid-state relay circuit of claim 17, wherein the high impedance voltage translation circuit comprises:

a third transistor configured to drive the gate terminal of the first transistor and the gate terminal of the second transistor, and comprising:

a first terminal coupled to a power supply terminal;

a second terminal coupled to the output terminal of the isolator circuit; and a third terminal coupled to the anode terminal of the second diode.

19. The solid-state relay circuit of claim 18, wherein the high impedance voltage translation circuit further comprises:

a fourth transistor configured to drive the third transistor, and comprising:

a first terminal coupled to the second terminal of the third transistor;

a second terminal coupled to the output terminal of the isolator circuit; and a third terminal coupled to ground.

* * * * *